United States Patent [19]

Ogura

[11] Patent Number: 5,650,042

[45] Date of Patent: Jul. 22, 1997

[54] METHOD FOR THINNING A SEMICONDUCTOR FILM ON AN INSULATING FILM

[75] Inventor: Atsushi Ogura, Tokyo, Japan

[73] Assignee: NEC Corporation, Japan

[21] Appl. No.: 534,441

[22] Filed: Sep. 27, 1995

[30] Foreign Application Priority Data

Sep. 27, 1994 [JP] Japan ................................ 6-231652
Apr. 24, 1995 [JP] Japan ................................ 7-097338

[51] Int. Cl.[6] ................................................ H01L 21/306
[52] U.S. Cl. ........................... 156/655.1; 156/657.1; 156/627.1; 156/654.1; 205/123; 205/221; 205/223
[58] Field of Search ................................ 205/123, 221, 205/223; 156/627.1, 655.1, 657.1

[56] References Cited

PUBLICATIONS

Mumola et al, "Plasma Thinned SOI Bonded Wafers", Mar. 1992, pp. 152–153, Hughes Danbury Optical Systems, Inc.
Mitani et al, "Wafer Bonding Technology for Silicon on Insulator Applications: A Review", 1992, pp. 669–676, Journal of Electronic Materials, vol. 21 No. 7.

*Primary Examiner*—R. Bruce Breneman
*Assistant Examiner*—Julie Ellyn Stein
*Attorney, Agent, or Firm*—Hayes, Soloway, Hennessey, Grossman & Hage, P.C.

[57] ABSTRACT

In an SOI substrate having a base substrate, an insulating film and a semiconductor active layer, a potential difference is given between the base substrate and an etching solution or among the base substrate, the semiconductor active layer and the etching solution to form a uniform depletion layer on the active layer side from the interface between the insulating film and the active layer. The semiconductor active layer is uniformly thinned down by etching using a solution or by the combination of chemical or electro-chemical surface and etching with the resultant reaction product. In this case, the individual electrodes are provided with seal members to prevent the base substrate electrode and the active layer electrode from contacting the etching solution or the reaction solution due to the etching using the etching solution or the chemical reaction using the reaction solution. According to this invention, therefore, the active layer in, for example, a bonded SOI substrate can be thinned down uniformly at a low cost.

10 Claims, 1 Drawing Sheet

METHOD FOR THINNING A SEMICONDUCTOR FILM ON AN INSULATING FILM

BACKGROUND OF THE INVENTION

1. Field of the Invention

The present invention relates to a method for forming a very uniform thin semiconductor layer on an insulating film provided on a base substrate in an SOI (Si On Insulator or Semiconductor On Insulator) structure which has a semiconductor layer on an insulator.

2. Description of the Related Art

Wafer bonding is one way of forming an SOI structure having a semiconductor active layer on an insulator. According to this method, at least one of two silicon substrates is oxidized to form a silicon oxide film which is an insulator, both substrates are put together with the silicon oxide film in between and are subjected to a heat treatment to be bonded together, and then the silicon substrate which will become an active layer is thinned down. Since the silicon substrate which is a single crystal is thinned down by this method, the SOI structure whose active layer has an excellent crystality can be obtained.

Conventional methods of thinning down the active layer include mechano-chemical polishing (MCP) and etching which uses an epitaxial layer as an etch-stop, as explained in detail in, for example, Journal of Electric Material, Vol. 21, No. 7, pp. 669–676, 1992). The former method has a difficulty in providing a uniform film thickness, and the active layer obtained by this method has a typical thickness and uniformity of 3 µm±0.5 µm, and cannot form a thin film (whose thickness is 0.1 µm, for example) which is effective in high-quality electronic devices. The latter method has a disadvantage of a complicated process for the epitaxial growth, which results in an increased cost. There is another method of precisely measuring the thickness of the active layer after mechano-chemical polishing and performs local plasma etching to etch the thick region longer than the other region, as described in, for example, 1992 IEEE International SOI Conference Proceedings, pp. 152–153. This method involves a complicated process and should face the plasma-oriented damage and contamination.

It is apparent from the above that while the bonded SOI has a great advantage of having an excellent crystality, it suffers a difficulty in providing an active layer with a uniform thickness, thus making it difficult to form a thin SOI structure effective in improving the performance of electronic devices. Further, the active layer in the bonded SOI structure was conventionally thinned down only by the method that suffers a lower precision in making the uniform thickness or the high-cost method that involves a complex process.

SUMMARY OF THE INVENTION

Accordingly, it is a primary object of the present invention to provide a method for thinning down a semiconductor active layer at a high precision and a low cost.

It is another object of this invention to provide a semiconductor film thinning method capable of forming a thin semiconductor active layer with a uniform thickness.

It is another object of this invention to provide a semiconductor film thinning method capable of forming a very thin semiconductor layer with a uniform thickness of 0.1 µm in an SOI structure having the semiconductor layer on an insulating film.

In vapor phase etching by most of a solution for chemically etching a semiconductor (e.g., a fluoronitric acid based solution, KOH based solution, hydrazine based solution, or the like) and further a part of gas, the etching speed greatly depends on the presence or absence of a carrier or the concentration of the carrier. The presence/absence of a carrier also significantly influences the reaction rate in many chemical or electrical reactions (e.g., anodic oxidation or anodizing).

When a carrierless depletion layer is formed in a semiconductor film, therefore, the rate of a reaction such as etching becomes considerably slow, the depletion layer serves as an etch-stop or a reaction-stop layer, making it possible to obtain a uniform active layer according to the uniform depletion layer.

According to this invention, a potential difference is given between the base substrate of a bonded SOI structure and a solution which contacts the active layer, a uniform depletion layer is formed from the bottom surface of the active layer (the interface between Si and $SiO_2$), and the resultant structure is subjected to the aforementioned etching or electro-chemical reaction to thin down the semiconductor active layer.

According to this approach, while the active layer should be a semiconductor film of silicon or the like, the base substrate has only to be conductive and need not meet any restriction on the crystal mode. As mentioned above, it is possible to use most chemical etchants (solutions) or chemical or electro-chemical reaction solutions.

The following describes the principle of the depletion layer serving as an etch-stop through the chemical etching using a fluoronitric acid based solution ($HF/HNO_3$/$CH_3COOH$ mixed solution) as one example. In etching Si with the $HF/HNO_3$ solution using $CH_3COOH$ as a buffer, the etching progresses in accordance the sequence of reactions expressed by the following formulae.

$$Si + 2h^+ \rightarrow Si^{2+} \qquad (1)$$

$$Si^{2+} + 2OH^- \rightarrow SiO_2 + H_2 \qquad (2)$$

$$Si^{2+} + 6HF \rightarrow H_2SiF_6 \text{ (water soluble)} + H_2O \qquad (3)$$

It is apparent that the presence/absence of a carrier (holes in this case) shown in the formula (1) performs a significant role on the progression of the etching. When the etching end reaches the end of the depletion layer, therefore, the lack of holes causes the etch-stop mechanism to work.

According to this invention, the film thickness uniformity which was difficult to acquire by the prior art can be obtained by a simple process, which prominently results in the reduction in process cost.

DETAILED DESCRIPTION OF THE PREFERRED EMBODIMENTS

Figure 1:
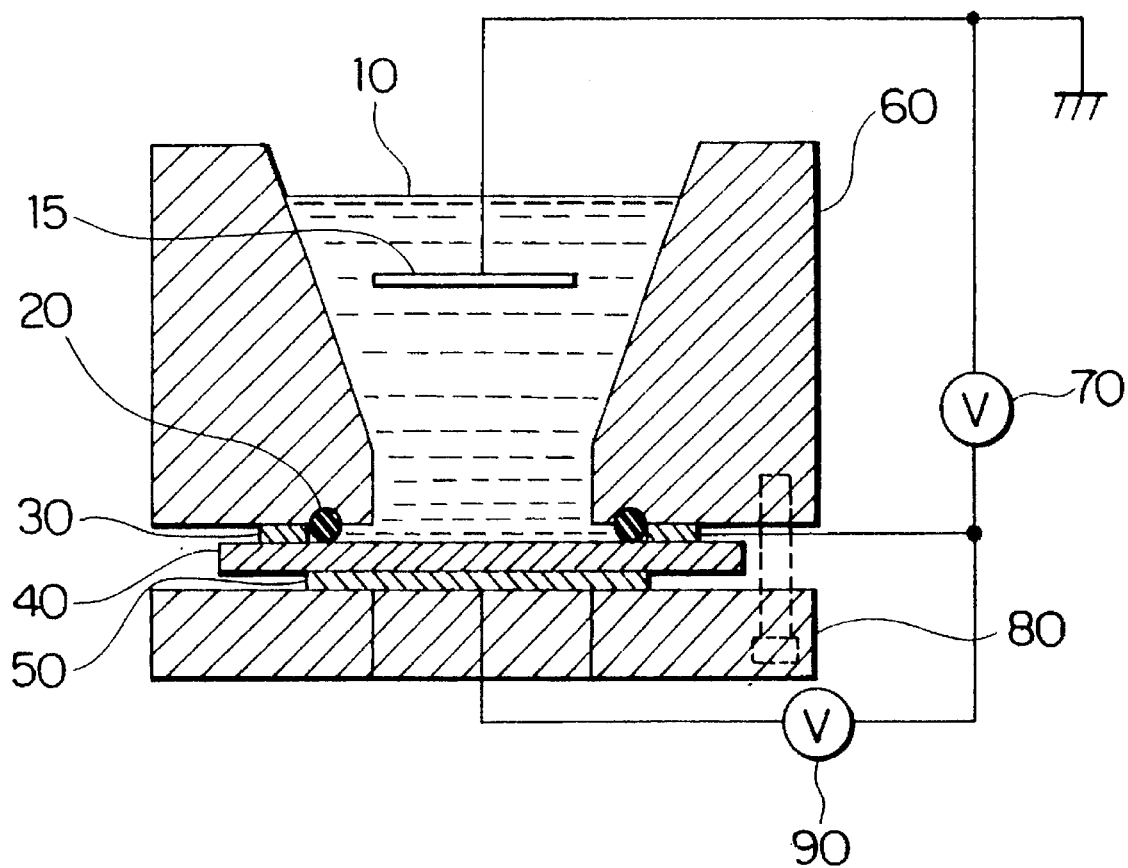
FIG. 1 is an exemplary diagram illustrating the structure of a film thinning apparatus used in embodiments of this invention.

Preferred embodiments of this invention will now be described in detail with reference to the accompanying drawings. FIG. 1 presents an exemplary diagram illustrating the structure of a film thinning apparatus used in the etching process and chemical reactions in the embodiments of this invention.

First Embodiment

A bonded SOI substrate 40 is obtained by using a P type Si substrate (specific resistance of 1 to 3 Ωcm and thickness of 625 μm) as the base substrate, thermally oxidizing another P type Si substrate (specific resistance of 1 to 3 Ωcm) which will become an active layer to form a silicon oxide film with a thickness of about 1 μm, and bonding both substrates, with the silicon oxide film contacting the base substrate, by a heat treatment. The active layer was polished by the ordinary mechanical or chemical polishing to be thinned down to have thickness of 3 to 5 μm. The precision of the film thickness is ±0.5 μm.

This SOI substrate was placed in the apparatus shown in FIG. 1 to undergo the film thinning process according to this embodiment. The SOI substrate 40 is placed in the apparatus in such a manner that the top of the substrate 40 becomes the semiconductor active layer side surface and the bottom surface becomes the base substrate side surface. A ring-shaped active layer electrode 30 (second electrode) is formed on the top of the SOI substrate 40, and a disk-shaped base substrate electrode 50 (first electrode) is formed on the bottom. Those electrodes 30 and 40 are gold-plated.

This SOI substrate 40 is placed on a sample platform 80. A teflon container 60 is place on the SOI substrate 40, which is thus secured between the sample platform 80 and the teflon container 60. The sample platform 80 and the teflon container 60 are secured by bolts or the like. There is space inside the teflon container 60 on the center side where an etching solution or a reaction solution 10 is to be retained.

An O ring 20, which is located inside the ring-shaped active layer electrode 30 on the SOI substrate 40, intervenes between the container 60 and the SOI substrate 40 to prevent the solution 10 in the container 60 from contacting the active layer electrode 30.

A platinum (Pt) electrode 15 (third electrode) is provided inside the container 60 so as to be in parallel to the SOI substrate 40 and face the SOI substrate 40. Accordingly, the electrode 15 is dipped in the solution 10 to give a potential to the solution 10.

A first voltage source 70 is connected between the electrode 15 and the active layer electrode 30, and a second voltage source 90 is connected between the active layer electrode 30 and the base substrate electrode 50. The electrode 15 is grounded. The voltage from the first voltage source 70 is applied between the electrode 15, dipped in the solution 10, and the active layer electrode 30, and the voltage from the second voltage source 90 is applied between the active layer electrode 30 and the base substrate electrode 50.

According to this embodiment, the semiconductor active layer was thinned down using the thus structured apparatus. First, an HF/HNO$_3$/CH$_3$COOH mixed solution having a mixing ratio of 1:3:10 was used as the solution 10. Etching was conducted with a solution added with iodine-saturated CH$_3$COOH instead of pure CH$_3$COOH. The potentials of the individual electrodes during etching are as follows. The Pt electrode 15 was grounded. To enhance the etch-stop effect, a voltage of +1 to 5 V was applied to the active layer electrode 30 by the first voltage source 70. To form a depletion layer in the active layer, a voltage of +0.5 to 10 V was applied between the base substrate electrode 50 and the active layer electrode 30 by the second voltage source 90.

The etching was automatically stopped after about 10 to 30 minutes. The thickness of the semiconductor active layer measured by an optical film thickness gauge varied between 0.5 μm and 3 μm in accordance the applied voltage, and its precision was ±0.01 μm.

When the active layer is a P type semiconductor film, it is necessary to apply a positive potential to the base substrate electrode 50 with respect to the active layer electrode 30, as mentioned above. When the active layer is an N type semiconductor film, on the other hand, it is necessary to apply a negative potential to the base substrate electrode 50. Since the width of the obtained depletion layer depends on the specific resistance of the active layer as well as the potential difference between the active layer electrode 30 and the base substrate electrode 50, the applied voltages to the individual electrodes should be adjusted each time to obtain the desired film thickness.

When iodine-saturated CH$_3$COOH was used, the flatness of the surface of the sample after etching was better than the one obtained by using the solution added with pure CH$_3$COOH.

Second Embodiment

The second embodiment used the same arrangement of the components and the same values of the applied voltages as used in the first embodiment, and used a 30% KOH solution for the solution 10 in conducting etching. When etching was performed with the solution temperature kept at 50° to 80° C., the etching stopped after about 5 to 10 minutes.

The thickness of the semiconductor active layer after etching and its distribution were the same as those of the first embodiment when the potentials of the individual electrodes were the same as those of the first embodiment. It was therefore confirmed that the thickness of the thinned semiconductor active layer did not depend on the type of the solution 10, but was determined by the width of the depletion layer.

As most solutions like a hydrazine solution besides the fluoronitric acid solution and KOH solution have different etch rates in the etching of the semiconductor active layer, depending on the presence/absence of the carrier and the carrier concentration, the same advantages can be expected even with other solutions than were used in the first and second embodiments by providing the proper potential difference.

Third Embodiment

The semiconductor active layer was oxidized in the same way as done in the first and second embodiments except that ethylene glycol was used for the solution 10 and the applied voltage from the first voltage source 70 was so controlled as to make the value of the current flowing between the Pt electrode 15 and the active layer electrode 30 constant. This approach, which is known as anodic oxidization, oxidized the semiconductor active layer from the surface side. With the constant current density of 20 mA/cm$^2$, when the applied voltage is increased to 50 V, the oxide film having a thickness of 100 to 300 angstroms was formed. This oxide film was removed by HF etching. As the active layer was thinned down by repeating the anodic oxidization and the HF etching of the oxide film, the oxidation stopped in a midway and the active layer had the same thickness and thickness distribution as those of the first and second embodiments. For anodic oxidization, a mixed solution of sodium tetraborate and boric acid or an N-methyl acetamide solution may be used instead of ethylene glycol.

Fourth Embodiment

The semiconductor active layer was oxidized in the same way as done in the first, second and third embodiments except that an HF/ethyl alcohol solution with the mixing ratio of 2:3 was used for the solution 10 and a voltage of 5 to 15 V was applied between the Pt electrode 15 and the active layer electrode 30 by the first voltage source 70. This approach, which is known as anodization, formed porous Si from the surface of the semiconductor active layer. The value of the current during anodization was approximately 20 to 80 mA/cm². The reaction stopped after 5 to 15 minutes, and only the porous Si layer was removed with the fluoronitric acid solution. The same thickness and thickness distribution of the thinned-down active layer were the same as those of the first to third embodiments.

In producing a reaction product not only by the reactions used in the second and third embodiments but also a chemical or electrical reaction on the semiconductor surface, the presence/absence of the carrier and the carrier concentration are expected to greatly influence the reaction rate. Such reaction can therefore be adapted in this invention.

Fifth Embodiment

The solutions used in the first to fourth embodiments were not used, but a potential difference of 1 to 5 V was provided between the base substrate and the active layer and plasma etching was executed using a $CCl_4$ gas. In this case, the reduction rate of the etching rate in the depletion layer where no carriers are present was smaller than those of the first and second embodiments. Although the thickness of the active layer obtained after the thinning process was 0.5 to 3 μm, therefore, the distribution precision had a lower uniformity of ±0.0 μm. This uniformity is however higher than the conventional one, so that the other advantages of gas etching can be utilized.

Gases other than $CCl_4$, which can etch semiconductor, can be expected to provide the same advantages. Besides plasma etching, hot temperature etching or other types of gas etching can also be used.

Sixth Embodiment

Under the conditions that etching was performed with any of the solutions used in the first to fourth embodiments and the electro-mechanical reaction and the removal of the reaction product were performed in the same way as done in the first to fourth embodiments, no voltage was applied to the active layer electrode 30 and voltages were applied only to the base substrate electrode 50 and the electrode 15 in the solution, thereby providing a potential difference between the base substrate and the solution. In this case, the same advantages as those of the other embodiments were obtained.

In this embodiment, the same bonded SOI substrate as used in the first to fifth embodiments was placed in the film thinning apparatus shown in FIG. 1 from which the active layer electrode 30 was removed, the Pt electrode 15 was placed in the container 60, and a voltage of 10 to 100 V was applied to the base substrate electrode 50 to provide a potential difference between the electrode 50 and the solution.

When etching was performed at 50° to 85° C. using a 10 to 40% KOH solution, etching stopped leaving the film thickness of 0.1 to 2 μm in accordance the applied voltage. After the KOH solution was discarded and samples were cleaned, the distribution of the film thickness was evaluated in detail using an optical film thickness gauge. The evaluation showed that a variation in the thickness distribution was controlled down to or below ±0.01 μm.

The reason why the same advantages as obtained with the use of the active layer electrode is that the potential difference given between the base substrate and the solution was actually distributed between the base substrate and the active layer and between the active layer and the solution. The possibility of reducing the number of electrodes by one can bring about not only the economical advantage resulting from the simple elimination of one electrode and one power supply, but also can produce significant advantages of increasing the etchable area of a sample's surface, relaxing the limitation on the conductivity of the active layer and improving the repeatability of etching.

What is claimed is:

1. A semiconductor-film thinning method of thinning down a semiconductor active layer formed on a base substrate via an insulating film, comprising:

a first step of providing a potential difference between said base substrate and said semiconductor active layer to form a depletion layer or an inversion layer and a depletion layer at an interface between said semiconductor active layer and said insulating film; and a second step of etching said semiconductor active layer by chemical etching using a solution or a chemical etching medium consisting of gas.

2. The method according to claim 1, wherein in said second step, seal members are attached to an electrode for said base substrate and an electrode for said semiconductor active layer to prevent said electrodes from contacting said etching medium.

3. The method according to claim 2, wherein a third electrode is provided in said etching solution to also provide a potential difference between said etching solution and said semiconductor active layer.

4. The method according to claim 1, wherein a third electrode is provided in said etching solution to also provide a potential difference between said etching solution and said semiconductor active layer.

5. A semiconductor-film thinning method of thinning down a semiconductor active layer formed on a base substrate via an insulating film, comprising:

a first step of providing a potential difference between said base substrate and said semiconductor active layer to form a depletion layer or an inversion layer and a depletion layer at an interface between said semiconductor active layer and said insulating film; and a second step of forming a reaction product layer by chemical or electro-chemical reaction between said semiconductor active layer and a reaction solution, and then removing said reaction product layer.

6. The method according to claim 5, wherein in said second step, seal members are attached to an electrode for said base substrate and an electrode for said semiconductor active layer to prevent said electrodes from contacting said reaction solution.

7. The method according to claim 6, wherein a third electrode is provided in said reaction solution to also provide a potential difference between said reaction solution and said semiconductor active layer.

8. The method according to claim 5, wherein a third electrode is provided in said reaction solution to also provide a potential difference between said reaction solution and said semiconductor active layer.

9. A semiconductor-film thinning method of thinning down a semiconductor active layer formed on a base substrate via an insulating film, comprising:

a first step of placing said base substrate, said insulating film and said semiconductor active layer in a chemical etching solution;

a second step of providing a potential difference between said base substrate and said etching solution to form a depletion layer or an inversion layer and a depletion layer at an interface between said semiconductor active layer and said insulating film; and a third step of chemically etching said semiconductor active layer with said etching solution.

10. A semiconductor-film thinning method of thinning down a semiconductor active layer formed on a base substrate via an insulating film, comprising:

a first step of placing said base substrate, said insulating film and said semiconductor active layer in a reaction solution;

a second step of providing a potential difference between said base substrate and said reaction solution to form a depletion layer or an inversion layer and a depletion layer at an interface between said semiconductor active layer and said insulating film; and a third step of reacting said semiconductor active layer with said reaction solution to produce a reaction product and removing said reaction product.

\* \* \* \* \*

UNITED STATES PATENT AND TRADEMARK OFFICE
CERTIFICATE OF CORRECTION

PATENT NO.   : 5,650,042
DATED        : July 22, 1997
INVENTOR(S)  : Atsushi OGURA It is certified that error appears in the above-indentified patent and that said Letters Patent is hereby corrected as shown below:

In claim 2, column 6, line 25, insert --said chemical etching solution or-- between "contacting" and "said";

In claim 3, column 6, lines 28 and 29, insert --chemical-- between "said" and "etching";

In claim 4, column 6, line 33, insert "chemical" between "said" and "etching".

In claim 9, column 6, line 66, insert --chemical-- between "said" and "etching"; and column 7, line 4, insert --chemical-- between "said" and "etching".

Signed and Sealed this

Eleventh Day of November, 1997

BRUCE LEHMAN

Attest:

Attesting Officer

Commissioner of Patents and Trademarks